United States Patent [19]
Hanson et al.

[11] Patent Number: 6,115,308
[45] Date of Patent: Sep. 5, 2000

[54] SENSE AMPLIFIER AND METHOD OF USING THE SAME WITH PIPELINED READ, RESTORE AND WRITE OPERATIONS

[75] Inventors: David R. Hanson, Brewster; Toshiaki Kirihata, Poughkeepsie, both of N.Y.

[73] Assignee: International Business Machines Corporation, Armonk, N.Y.

[21] Appl. No.: 09/335,092

[22] Filed: Jun. 17, 1999

[51] Int. Cl.[7] ............................. G11C 7/00; G11C 7/02
[52] U.S. Cl. ........................................ 365/205; 365/207
[58] Field of Search .................................. 365/205, 203, 365/207, 208, 189.04, 189.05

[56] References Cited

U.S. PATENT DOCUMENTS

| | | | |
|---|---|---|---|
| 4,077,031 | 2/1978 | Kitagawa et al. | 365/205 |
| 4,078,261 | 3/1978 | Millhollan et al. | 365/205 |
| 5,327,379 | 7/1994 | Pascucci | 365/203 |
| 5,526,314 | 6/1996 | Kumar | 365/207 |
| 5,671,187 | 9/1997 | Childers et al. | 365/205 |
| 5,699,305 | 12/1997 | Kawashima | 365/190 |
| 5,757,707 | 5/1998 | Abe | 365/203 |
| 5,841,730 | 11/1998 | Kai et al. | 365/233 |

*Primary Examiner*—Richard Elms
*Assistant Examiner*—Anh Phung
*Attorney, Agent, or Firm*—McGinn & Gibb, P.C.; Daryl K. Neff, Esq.

[57] ABSTRACT

A method of performing overlapping operations with a memory device may have a sense amplifier circuit and two drivers connected to the sense amplifier circuit. Two data bus lines may be connected to the sense amplifier circuit to receive data signals. The method may include applying a first equalize signal and second equalize signal to the sense amplifier circuit to allow the sense amplifier circuit to receive the data signals across the data bus lines, applying a switch signal to the sense amplifier circuit to connect the data bus lines to a read data bus, and changing a state of the first equalize signal such that the data bus lines either receive new data or the data bus lines are equalized to a predetermined voltage while the data is on the read data bus and is capable of being read.

24 Claims, 9 Drawing Sheets

SENSE AMPLIFIER AND METHOD OF USING THE SAME WITH PIPELINED READ, RESTORE AND WRITE OPERATIONS

BACKGROUND OF THE INVENTION

1. Field of the Invention

The present invention generally relates to a sense amplifier and method that allows pipelined read, restore and write operations.

2. Description of the Related Art

In fast page asynchronous DRAMs, the column access cycle time is limited by the column address access path. As a result, improvements are limited by the column address access time. EDO (Extended Data Out) DRAMs use a pipelined operation for the address and data paths, allowing faster hyper-column cycle time. Synchronous DRAMs (SDRAMs) utilize an internal burst counter to increment the address, which further improves the column burst cycle time. This improvement limits the column access cycle time to the rate at which data is transferred from the main sense amplifier to the data output circuit. In order to improve the column access/cycle time, it is important to perform successive read, write, and restore operations. However, this is difficult due to data congestion on global data lines and read-write data busses.

FIG. 9 shows a block diagram of the column access path of an illustrative memory circuit. The memory chip comprises a memory array 13 connected over bitlines (BLt and BLc) to a plurality of first sense amplifiers 14, which are connected to multiplexor 16 and connected over global data lines, MDQt and MDQc, to the second sense amplifier 24. In a read mode, the first sense amplifiers 14 amplify a charge from the memory cell in the memory array 13 and transfer the information in the form of a small differential signal (0.1V to 0.3V) through the multiplexor 16 to the second sense amplifier 24. A specific column address determines which data is transferred. The transfer of information is initiated with a column select latch (CSL) signal, which opens at least one MUX 16. The second sense amplifier 24 translates the small differential signal to a higher level to be transferred to and out of the package (I/O) by the off chip driver/receiver 28. In a write mode, the off chip driver/receiver 28 transfers data to be written from the I/O to the second sense amplifier 24. The second sense amplifier 24 transfers a large differential signal over the global data lines, MDQt and MDQc, through the multiplexor 16 to a specific first sense amplifier 14 (determined by the column address) to be written into the memory cell of the memory array 13. Again, the transfer of information is initiated with a column select latch (CSL) signal, which opens at least one MUX 16.

FIG. 6 shows a prior art sense amplifier that includes some of the problems discussed above. In particular, the read, restore (precharge), and write operations are performed separately or discretely in time. This type of sense amplifier does not permit overlapping of successive read operations, restore operations, write operations, or combinations of read/restore/write operations and accordingly results in a slower operation.

First, a read and restore operation will be discussed. The equalization signal EQLn rises to logic '1' to terminate restoration and equalization of the true and complement global data buses MDQt and MDQc, respectively. To perform a read operation, the sense amplifier switch signal SSASWn at gates of the transistors P4 and P5 switches to logic '0' to transfer data on the global data buses MDQt/MDQc into the sense amplifier. Subsequently, the sense amplifier enable signal SSAE at the gate of transistor N3 switches to logic '1' to amplify and latch the transferred data. The input signal DRVn to the NOR gates I1 and I2 then switches to logic '0' to send the amplified data to the gates of the output transistors N4 and N5. Since either of the transistors N4 or N5 conducts (depending on the state of the data), the amplified data value is placed on the differential buses RWDt and RWDc. The sense amplifier enable signal SSAE at the gate of the transistor N3 then switches to logic '0' to terminate the read operation. The equalization signal EQLn switches to a logic '0', the global data buses MDQt and MDQc are restored and equalized to a logic '1' and the sense amplifier nodes GDt and GDc are equalized. The next read or write operation can occur.

The sense amplifier switch signal SSASWn and the DRVn signal are logic '1' and sense amplifier enable signal SSAE is logic '0' to disable the sense amplifier. The equalization signal EQLn rises to logic '1' to terminate restoration and equalization of the global data buses MDQc and MDQt. To perform a write operation, the write gate signal WGTn then falls to logic '0'. For a write '0' operation, the RWDt signal will be logic '0' and the RWDc signal will be logic '1'. This causes the gate of the transistor N6 to be logic '1'. The transistor N6 will conduct and pull the global data bus MDQt down to logic '0'. The gate of the transistor P10 will be at logic '0'. The transistor P6 will conduct and pull the global data bus up to logic '1'. For a write '1' operation, the RWDt signal will be logic '1' and the RWDc signal will be logic '0'. This causes the gate of the transistor P9 to be logic '0'. The transistor P9 will conduct and pull the global data bus MDQt up to logic '1'. The gate of transistor N7 will be at logic '1'. The transistor N7 will conduct and pull the global data bus MDQc down to logic '0'. The write gate signal WGTn then rises to logic '1' to terminate the write operation. Subsequently, the equalization signal EQLn switches to a logic '0' and the global data buses MDQt and MDQc are restored and equalized to a logic '1'.

Since the restoring and the equalization of the global data lines MDQt and MDQc and internal sense amplifier nodes GDt and GDc are controlled by the same signal (i.e., the equalization signal EQLn), the read and restore operations cannot be overlapped and thus the read, write or restore modes cannot be executed simultaneously. FIGS. 7 and 8 show the timing of the respective signals during each of the read, write and restore operations. As can be clearly seen from these Figs.s, the different operations cannot be overlapped and thus the prior art sense amplifier cannot operate in a pipelined manner. This limits further improvements to the column access time. A further disadvantage is that the prior art sense amplifiers use differential busses RWDt and RWDc that swing from 0V to the on-chip uplevel of Vint. Since these lines are heavily loaded, this requires a large amount of current to charge and discharge the signal lines.

SUMMARY OF THE INVENTION

In view of the foregoing and other problems of the conventional methods, it is, therefore, an object of the present invention to provide a structure and method for performing pipelined read, restore and write operations. That is, a sense amplifier provides pipelining technique for read, write and restore operations. This enables the chip to run at higher frequencies.

It is an object of the present invention to provide a method of performing overlapping operations. A memory device is provided having a sense amplifier circuit and two drivers connected to the sense amplifier circuit and two data bus lines that are connected to the sense amplifier circuit to receive data signals. The method may apply a first equalize signal and second equalize signal to the sense amplifier circuit to allow the sense amplifier circuit to receive the data signals on the data bus lines. A switch signal may be applied to the sense amplifier circuit to connect the data bus lines to a read data bus. The switch signal may allow data corresponding to the data signals to be read on the read data bus. While the data is on the read data bus and is capable of being read, a state (high or low) of the first equalize signal may be changed such that one of the data bus lines receives new data and the data bus lines are equalized to a predetermined voltage.

A first column select signal may be applied to the sense amplifier circuit prior to applying the first and second equalize signals and a second column select signal may be applied to the sense amplifier after the data has been read on the read data bus and the data bus lines have received new data or have been equalized to a predetermined voltage.

A driver may be included with a first and second input line to receive first and second input signals, respectively. The first and second input signals may determine operational states of the sense amplifier circuit by electrically connecting the drivers to the data bus lines. A state of the first input signal may then be changed prior to changing the state of the first equalize signal. A voltage may also be changed on the data bus lines to a voltage of a power supply when the first input signal changes state.

Other objects, advantages and salient features of the invention will become apparent from the following detailed description taken in conjunction with the annexed drawings, which disclose preferred embodiments of the invention.

BRIEF DESCRIPTION OF THE DRAWINGS

The invention will be described in detail with reference to the following drawings in which like reference numerals refer to like elements and wherein.

DETAILED DESCRIPTION OF PREFERRED EMBODIMENTS OF THE INVENTION

Figure 1:
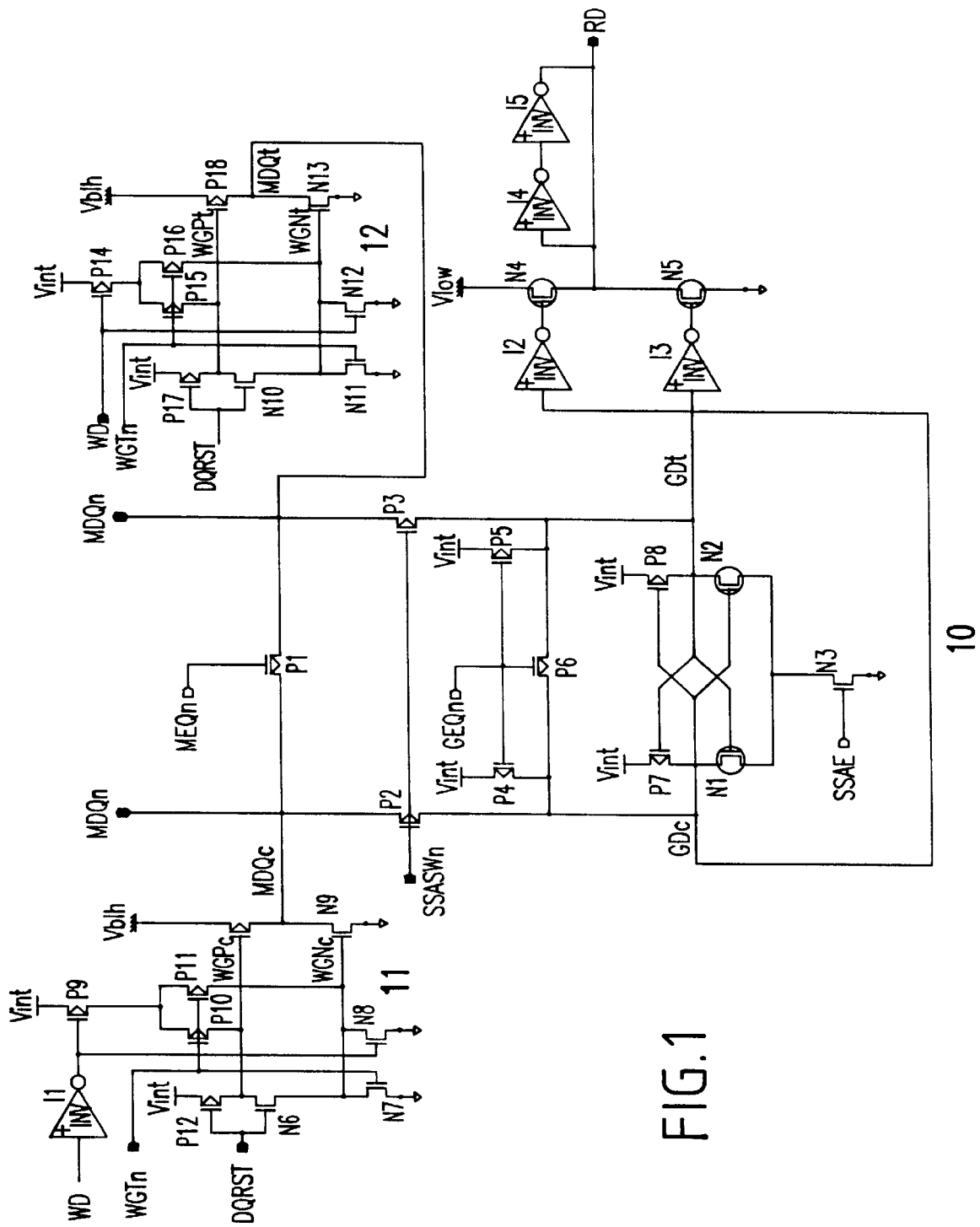
FIG. 1 is a schematic diagram of a sense amplifier circuit according to the present invention.

FIG. 1 shows a circuit according to the present invention. Generally speaking, the circuit includes a sense amplifier 10 and two write/restore drivers 11 and 12. Global data buses MDQt and MDQc are also shown. In this embodiment, six signals control operation of the circuit shown in FIG. 1. They include: (1) the write gate signal WGTn; (2) the MDQ read and restore signal DQRST; (3) the MDQ equalize signal MEQn; (4) the sense amplifier equalize signal GEQn; (5) the sense amplifier switch signal SSASWn; and (6) the sense amplifier enable signal SSAE. These signals are generated by a control circuit (not shown). The write gate signal WGTn, the MDQ equalize signal MEQn, the sense amplifier equalize signal GEQn and the sense amplifier switch signal SSASWn are active low. This means that their respective operation begins when a "1" or "0" occurs and terminates with a "0" or "1". When the sense amplifier switch signal SSASWn is active, the data on the MDQ data bus is loaded into the sense amplifier 10. The sense amplifier enable signal SSAE is active high and thus when the sense amplifier enable signal SSAE is active, then data on the MDQ data bus is amplified. Table 1 demonstrates how the write gate signal WGTn and MDQ read and restore signal control the respective states of the circuit.

TABLE 1

| WGTn | DQRST | Function |
| --- | --- | --- |
| 0 | 0 | Not Allowed |
| 0 | 1 | Write |
| 1 | 0 | Read |
| 1 | 1 | Restore |

Restore, read, and write operations will now be described with respect to the circuit shown in FIG. 1. One skilled in the art would appreciate that this circuit is exemplary of the present invention and modifications can be made from the circuit without departing from the invention. The circuit is normally in a restore state in which the global data buses MDQt and MDQc are precharged to the potential of the Vblh power supply (approximately 1.5V). The sense amplifier data lines GDt and GDc are precharged to the potential of the Vint power supply (approximately 2.1V). The output of the sense amplifier 10 is in a high-impedance state and disconnected from the read data bus RD.

During a restore operation, both the write gate WGTn and the MDQ read and restore signal DQRST of the write/restore driver circuit 11 will be high (or logic level '1'). This causes NFET transistor N7 to conduct and the PFET transistors P10 and P11 not to conduct. Conduction of NFET transistor N7 causes the gate terminal of the NFET transistor N9 to fall to the ground potential, which renders the NFET transistor N9 non-conductive. Because the DQRST signal is high, the NFET transistor N6 will conduct and the PFET transistor P12 will not conduct. Conduction of NFET transistor N6 causes the gate terminal of PFET transistor P13 to fall to the ground potential and the PFET transistor P13 will conduct. Conduction of the PFET transistor P13 charges the global data line MDQc to the potential of the Vblh power supply.

The write/restore driver circuit 12 operates in a similar manner to the write/restore driver circuit 11. That is, when the write gate signal WGTn is high, the NFET transistor N11 conducts and the PFET transistors P15 and P16 do not conduct. Conduction of the NFET transistor N11 causes the gate terminal of the NFET transistor N13 to fall to the ground potential, which makes the NFET transistor N13 non-conductive. Because the MDQ read and restore signal DQRST is high, the NFET transistor N10 will conduct and the PFET transistor P17 will not conduct. Conduction of the NFET transistor N10 causes the gate terminal of PFET transistor P18 to fall to the ground potential and the PFET transistor P18 will conduct. Conduction of the PFET transistor P18 charges the global data line MDQt to the potential of the Vblh power rail.

During a restore operation, the MDQ equalize signal MEQn, the sense amplifier equalize signal GEQn and the sense amplifier enable signal SSAE will be low (or logic level '0') while the sense amplifier switch signal SSASWn will be high (or logic level '1'). When the MDQ equalize signal MEQn is low, then the PFET transistor P1 will conduct and equalize the global data bus MDQt and MDQc to the potential of the Vblh power rail. Because the sense amplifier equalize signal GEQn is low, the PFET transistors P4, P5, and P6 will conduct, which restores and equalizes the potential of the sense amplifier data lines GDt and GDc to Vint. Because the sense amplifier enable signal SSAE is low, the NFET transistor N3 will not conduct and the amplifier circuit comprised of the NFET transistors N1 and N2 and the PFET transistors P7 and P8 will be inactive. Further, because the sense amplifier data lines GDt and GDc are at a high potential, the gate terminals of NFET transistors N4 and N5 will be at a low potential and they will be non-conductive. This causes the output stage comprised of NFET transistors N4 and N5 to be in a high-impedance state. The potential on the read data bus RD will maintain the previous state using the latch circuit comprised of inverters 14 and 15.

Read operations will now be described. During a read operation, the write gate signal WGTn at the driver circuit 11 will be high (or logic level '1'). Read operation begins when the MDQ read and restore signal DQRST switches from a high (or logic level '1') to a low (or logic level '0'). Because the write gate signal WGTn is high, the NFET transistor N7 will conduct and the PFET transistors P10 and P11 will not conduct. Conduction of the NFET transistor N7 causes the gate terminal of the NFET transistor N9 to fall to the ground potential, which renders the NFET transistor N9 non-conductive. Because the MDQ read and restore signal DQRST is low, the NFET transistor N6 will not conduct and the PFET transistor P12 will conduct. Conduction of the PFET transistor P12 causes the gate terminal of the PFET transistor P13 to rise to the upper power rail (Vblh) and the PFET transistor P13 will not conduct. This causes the output stage comprised of NFET transistor N9 and the PFET transistor P13 to be in a high-impedance state and disconnected from the global data line MDQc.

The write/restore driver circuit 12 operates similarly to the write/restore driver circuit 11 during a read operation. The write gate signal WGTn signal is high and thus the NFET transistor N11 will conduct and the PFET transistors P15 and P16 will not conduct. Conduction of the NFET transistor N11 causes the gate terminal of the NFET transistor N13 to fall to the ground potential, which renders the NFET transistor N13 non-conductive. Because the MDQ read and restore signal DQRST is low, the NFET transistor N10 will not conduct and the PFET transistor P17 will conduct. Conduction of the PFET transistor P17 causes the gate terminal of the PFET transistor P18 to rise to the upper power rail (Vblh) and the PFET transistor P18 will not conduct. This causes the output stage comprised of NFET transistor N13 and the PFET transistor P18 to be in a high-impedance state and disconnected from the global data line MDQt.

As discussed above, a read operation begins with the transition of the MDQ read and restore signal DQRST from high to low. When this transition occurs, the MDQ equalize signal MEQn and sense amplifier equalize signal GEQn switch from low to high. This causes the PFET transistors P1, P4, P5, and P6 to be non-conductive and terminate equalization of the global data bus MDQc/MDQt and sense amplifier data lines. The rising of the MDQ equalize signal MEQn allows signal development on the global data buses MDQc and MDQt. A signal difference of several hundred millivolts will develop as a function of time. For example, when reading a logic level '1', the difference between the potential on data buses MDQt and MDQc will be approximately 200 mV (MDQt-MDQc=+0.2V). When reading a logic level '0', the difference between the potentials on each of the data buses MDQc and MDQt will be approximately 200 mV (MDQt-MDQc=-0.2V).

The sense amplifier switch signal SSASWn switches from a high to a low causing the PFET transistors P2 and P3 to conduct. This connects the data buses MDQt and MDQc to the sense amplifier data nodes GDt and GDc, respectively, and loads the data to be amplified. After allowing time for the signal development, the sense amplifier enable signal SSAE rises from a low to a high and the small differential between the sense amplifier data nodes GDt and GDc is amplified. For example, when reading a logic level '1', the sense amplifier data node GDt will have a higher potential than the sense amplifier data node GDc. This causes the NFET transistor N1 and the PFET transistor P8 to be conductive and the NFET transistor N2 and the PFET transistor P7 to be non-conductive. The potential difference between the two data nodes GDt and GDc is amplified rail to rail. The sense amplifier data node GDt will be at the potential of the upper power rail (Vblh) and the sense amplifier data node GDc will be at the potential of the lower power rail (i.e., ground). Because the data node GDt is at a high potential and the data node GDc at a low potential, the gate of the NFET transistor N5 will be at a low potential and the gate of NFET transistor N4 will be at a high potential. The NFET transistor N4 conducts and pulls the read data bus RD up to the Vlow power rail (approximately 1V).

When reading a logic level '0', the data node GDc will have a higher potential than the data node GDt. This causes the NFET transistor N1 and the PFET transistor P8 to be non-conductive and the NFET transistor N2 and the PFET transistor P7 to be conductive. The difference between the data nodes GDt and GDc will be amplified rail to rail. The data node GDc will be at the potential of the upper power rail (Vblh) and the data node GDt will be at the potential of the lower power rail (ground). With the data node GDc at a high potential and the data node GDt at a low potential, the gate of the NFET transistor N4 will be at a low potential and the gate of the NFET transistor N5 will be at a high potential. The NFET transistor N5 conducts and pulls the read data bus RD down to the lower power rail (ground). During the time that data amplification is taking place, the sense amplifier switch signal SSAE switches from low to high isolating the global data buses MDQc/MDQt from the amplification data lines. The read operation terminates when the sense amplifier enable signal SSAE switches from a high to a low.

Figure 2:
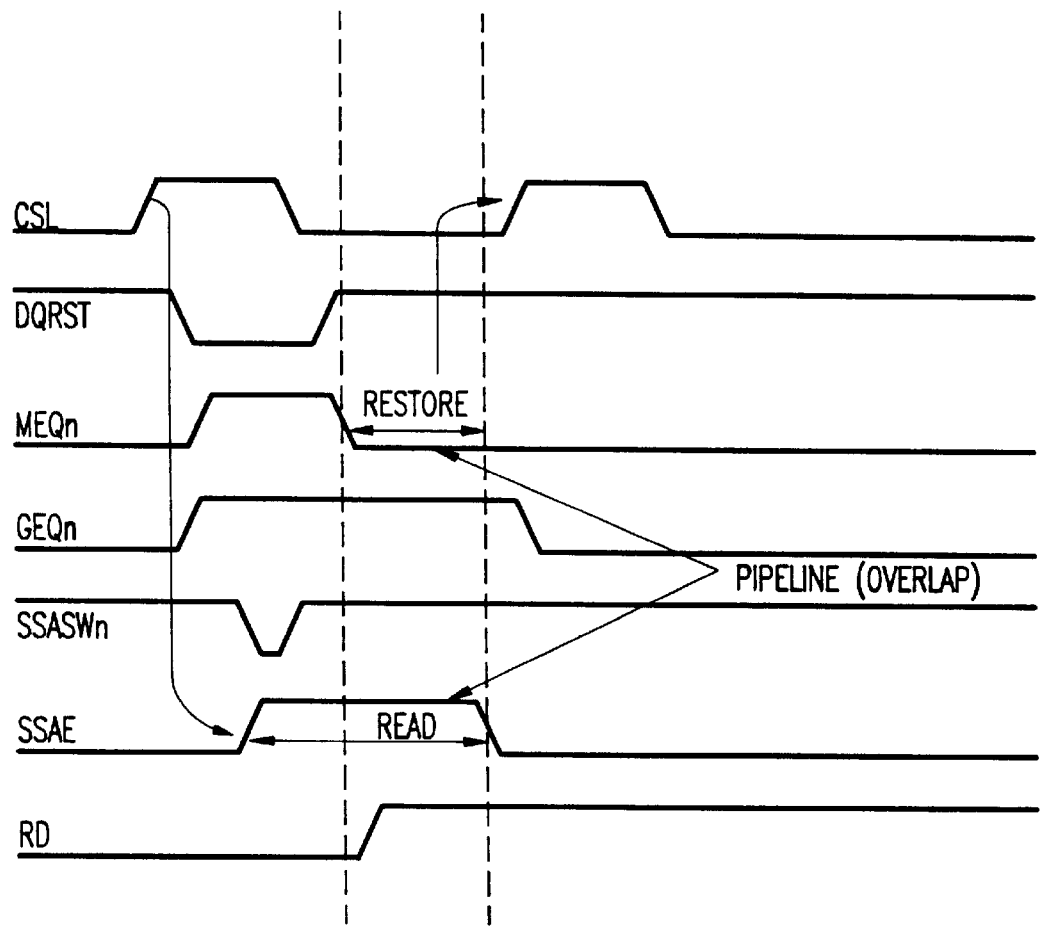
FIG. 2 shows the overlapping of the read and restore operations according to the present invention.
Figure 6:
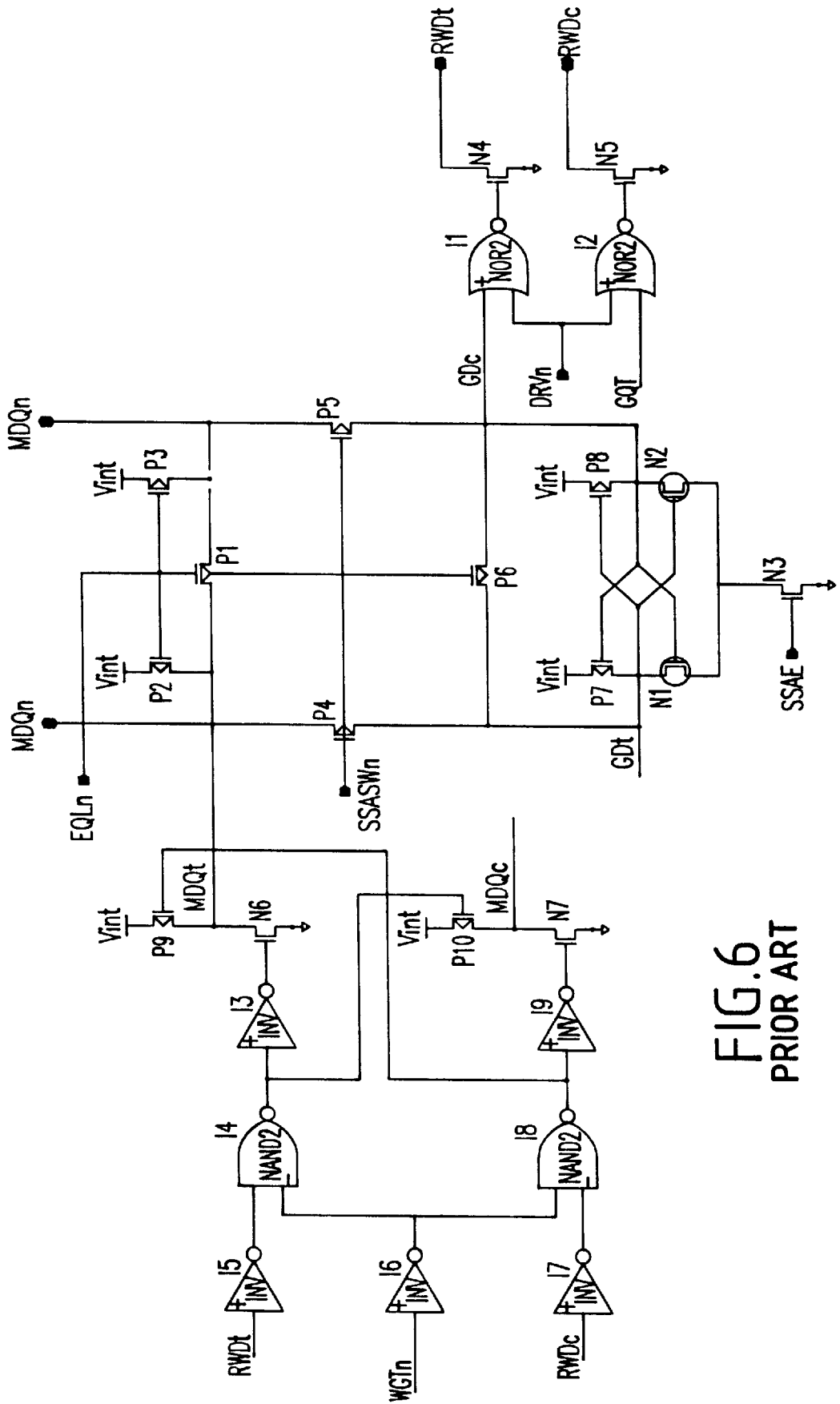
FIG. 6 shows a prior art sense amplifier circuit.
Figure 7:
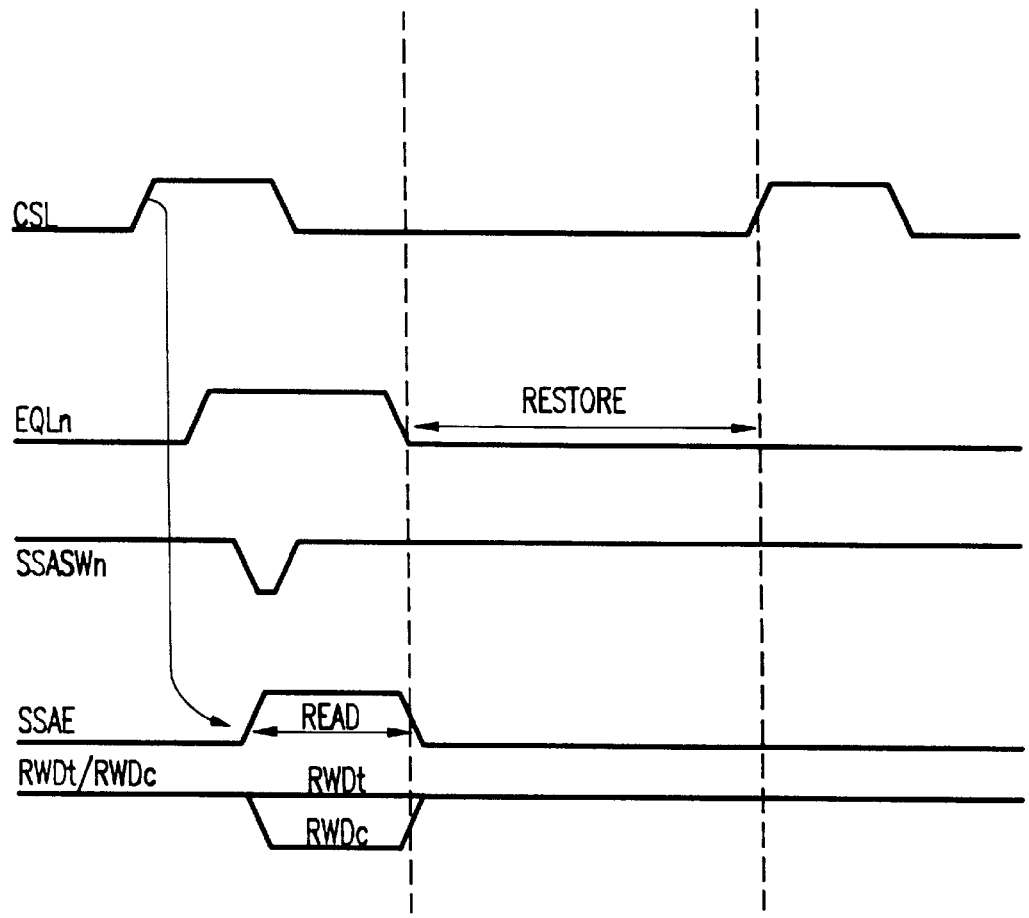
FIG. 7 shows the read and restore operations using the sense amplifier circuit shown in FIG. 6.
Figure 8:
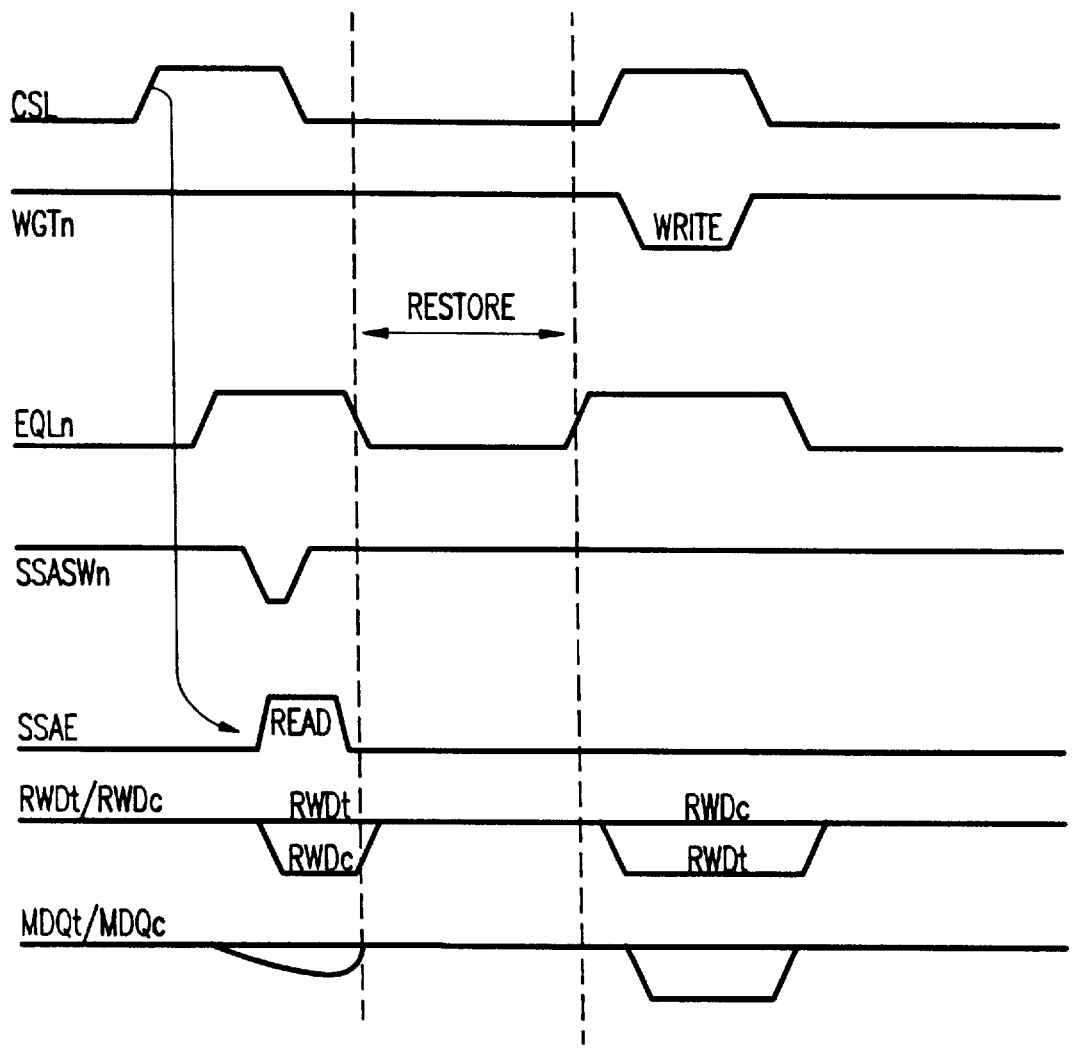
FIG. 8 shows the read, restore and write operations using the sense amplifier circuit shown in FIG. 6.
Figure 9:
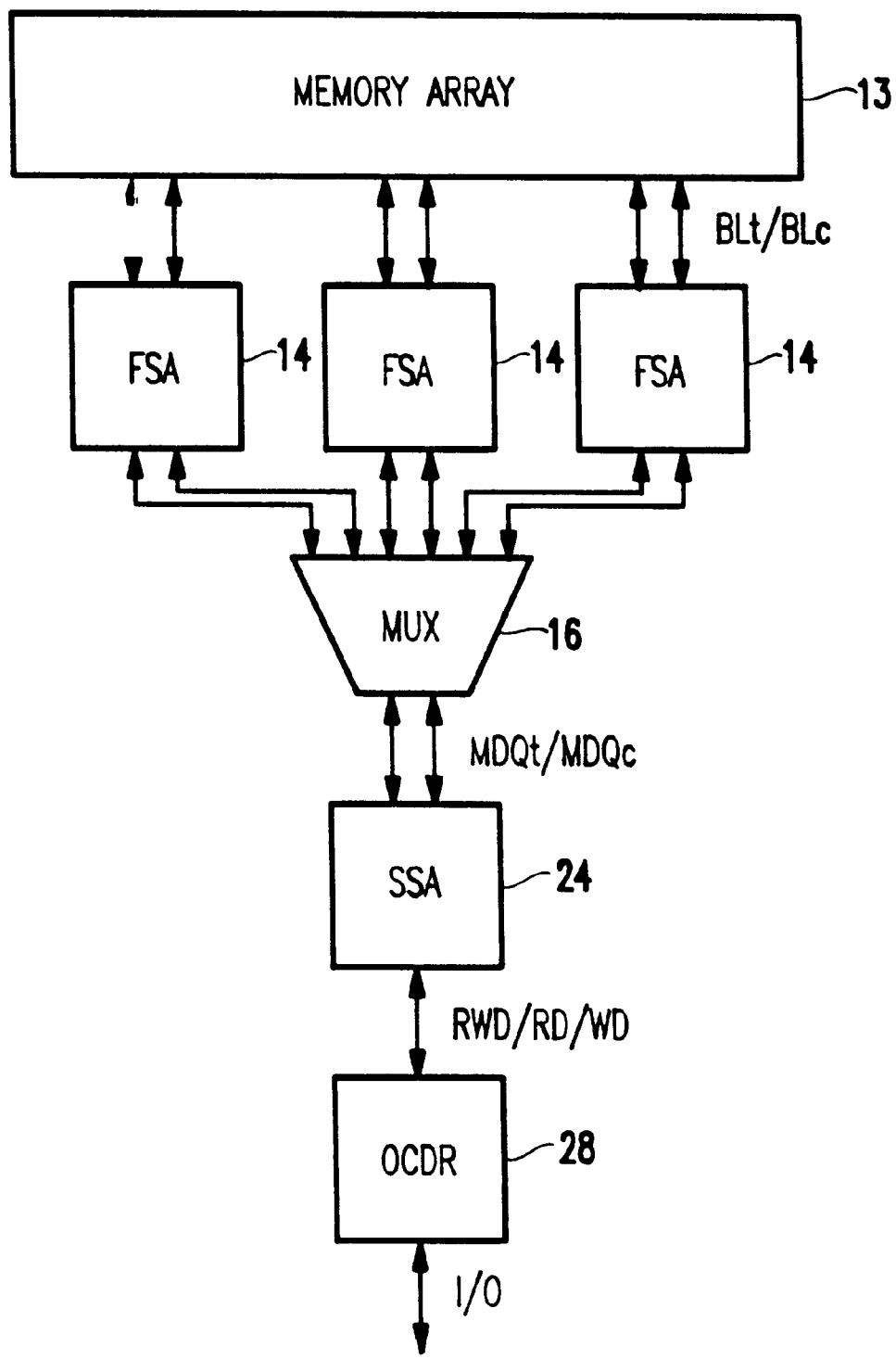
FIG. 9 shows a block diagram of a memory circuit.

FIG. 2 shows the read '1' operation and the respective timings of the signals. FIG. 2 also shows the pipelined read and restore operations of the present invention. More particularly, the column select latch signal CSL indicates the activation of a first and second column address. The termination of the read operation begins when MDQ read and restore signal DQRST switches from low to a high. This causes the MDQ equalize signal MEQn to switch from a high to low and restoration and equalization of the global data buses MDQc and MDQt to the potential of Vblh power rail begins for the second column address. The sense amplifier enable signal SSAE is still high and a read operation of the first column address is still occurring. Overlapping or pipelining of the MDQ restore and read operations is clearly shown on the graph. The prior art sense amplifier shown in FIG. 6 is not capable of this type of overlapping.

The write operation will now be described with the respect to the FIG. 1 embodiment. During a write operation, the write gate signal WGTn signal will be low (or logic level '0') and the MDQ read and restore signal DQRST will be high (or logic level '1'). Because the write gate signal WGTn signal is low, the NFET transistor N11 will not conduct and the PFET transistors P15 and P16 will conduct. If a write '0' is occurring, then the write data bus WD will be low (or logic level '0'), which causes the PFET transistor P14 to conduct and the NFET transistor N12 not to conduct. Conduction of the PFET transistors P14 and P16 causes the gate terminal of the NFET transistor N13 to rise to the upper power rail (Vblh), which renders the NFET transistor N13 conductive. Conduction of the NFET transistor N13 discharges the global data line MDQt to the potential of the lower power rail (i.e., ground). Conduction of the PFET transistors P14 and P15 causes the gate terminal of the PFET transistor P18 to rise to the upper power rail (Vblh) and the PFET transistor P18 will be non-conductive. If a write '1' is occurring, the write data bus WD will be high or logic level '1', which causes the PFET transistor P14 to be non-conductive and the NFET transistor N12 to be conductive. Conduction of the NFET transistor N12 causes the gate terminal of the NFET transistor N13 to fall to the lower power rail (i.e., ground), which renders the NFET transistor N13 non-conductive. As discussed above, the MDQ read and restore signal DQRST is high during a write operation and accordingly the NFET transistor N10 will conduct. Conduction of the NFET transistors N10 and N12 causes the gate terminal of the PFET transistor P18 to fall to the lower power rail (ground) and the PFET transistor P18 will conduct and pull the global data bus MDQt to the Vblh power rail.

The write/restore driver circuit 11 operates in a similar manner to the write/restore driver circuit 12 during a write operation. When the write gate signal WGTn signal is low, the NFET transistor N7 will not conduct and the PFET transistors P10 and P11 will conduct. If a write '0' is occurring, the write data bus WD will be low (or logic level '0'), which causes the PFET transistor P9 to be non-conductive and the NFET transistor N8 to be conductive. Conduction of NFET transistor N8 causes the gate terminal of the NFET transistor N9 to fall to the lower power rail (ground), which renders the NFET transistor N9 non-conductive. As discussed above, the MDQ read and restore signal DQRST is high during a write operation, and the NFET transistor N6 will conduct. Conduction of the NFET transistors N6 and N9 causes the gate terminal of the PFET transistor P13 to fall to the lower power rail (ground) and the PFET transistor P13 will conduct and pull the global data bus MDQc to the Vblh power rail. If a write '1' is occurring, then the write data bus WD will be high or logic level '1'. This causes the PFET transistor P9 to conduct. Conduction of PFET transistors P9 and P11 causes the gate terminal of NFET transistor N9 to rise to the upper power rail (Vblh) rendering the NFET transistor N9 conductive. Conduction of the NFET transistor N9 discharges the global data line MDQc to the potential of the lower power rail (i.e., ground). Conduction of the PFET transistors P9 and P10 causes the gate terminal of the PFET transistor P13 to rise to the upper power rail (Vblh) and the PFET transistor P13 will be non-conductive.

Figure 3:
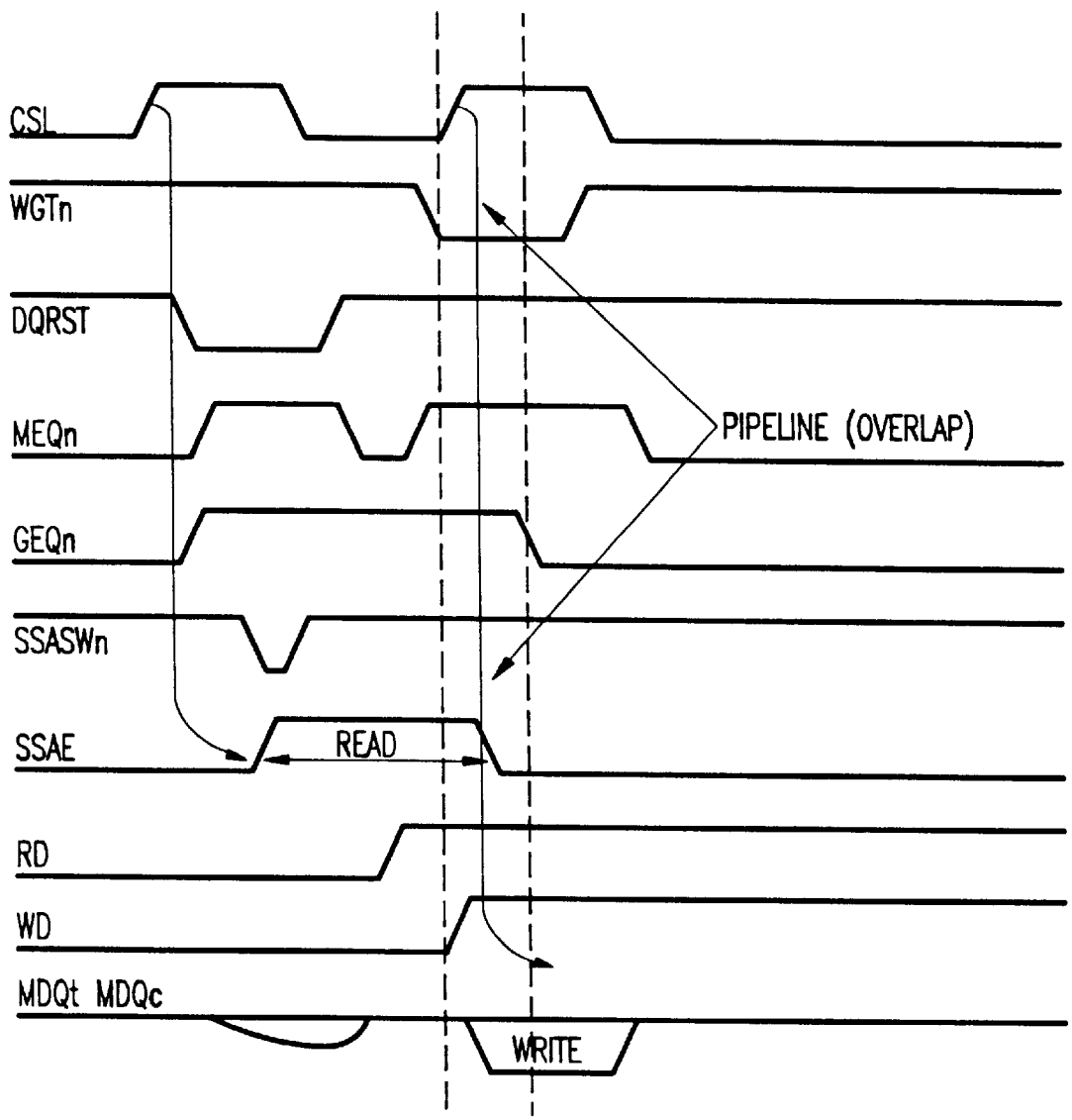
FIG. 3 shows the overlapping of the read and write operations according to the present invention.

FIG. 3 illustrates the pipelining of the write and read operations. The column select latch CSL signal indicates the activation of a first and second column address. As discussed above, the sense amplifier switch signal SSASWn switches from low to high during the read operation thereby isolating the global data buses MDQt and MDQc from the sense amplifier data lines GDt and GDc and so that the read operation of the first column address and the write operation of the second column address can overlap. The prior art sense amplifier shown in FIG. 6 is not capable of this overlapping.

Figure 4:
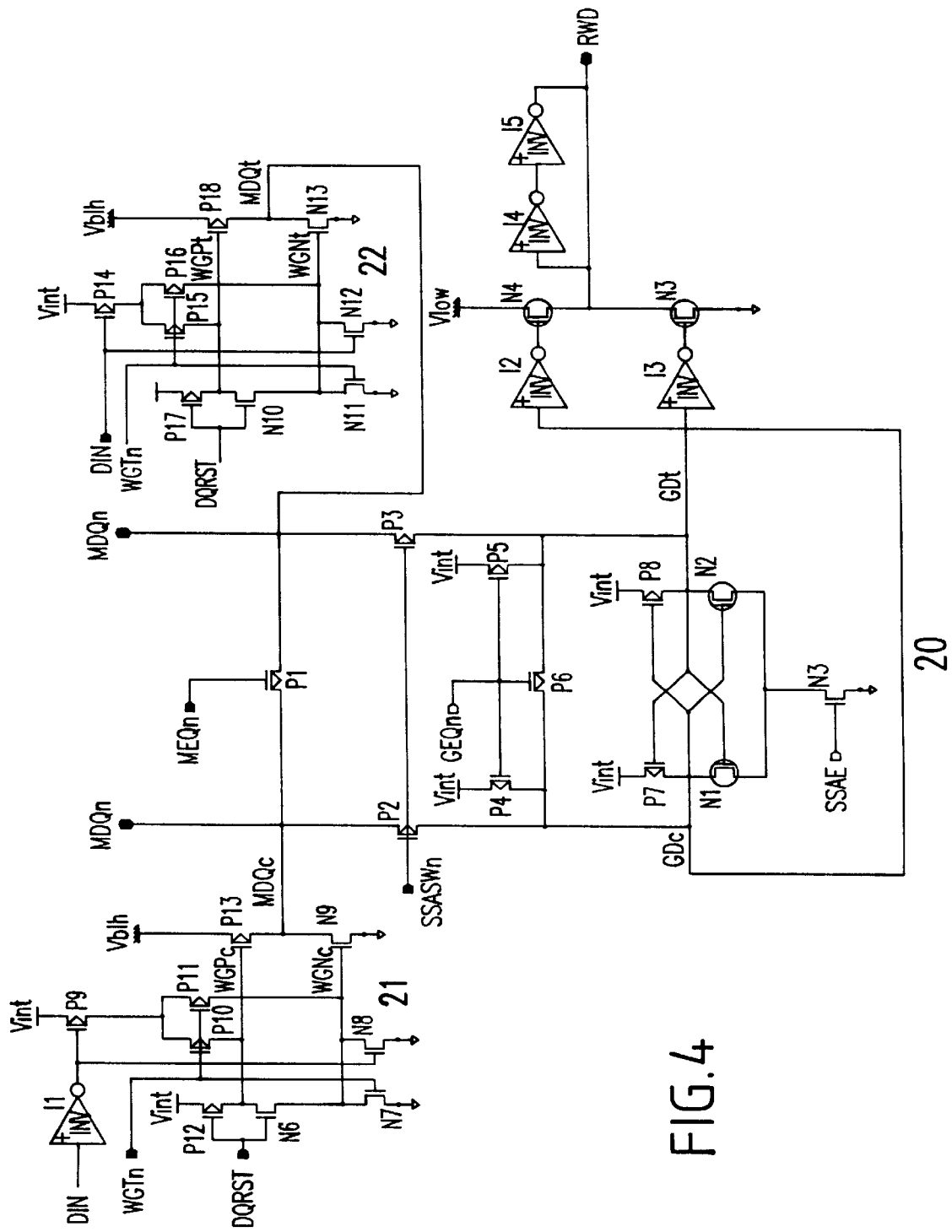
FIG. 4 shows another embodiment of the sense amplifier according to the present invention.
Figure 5:
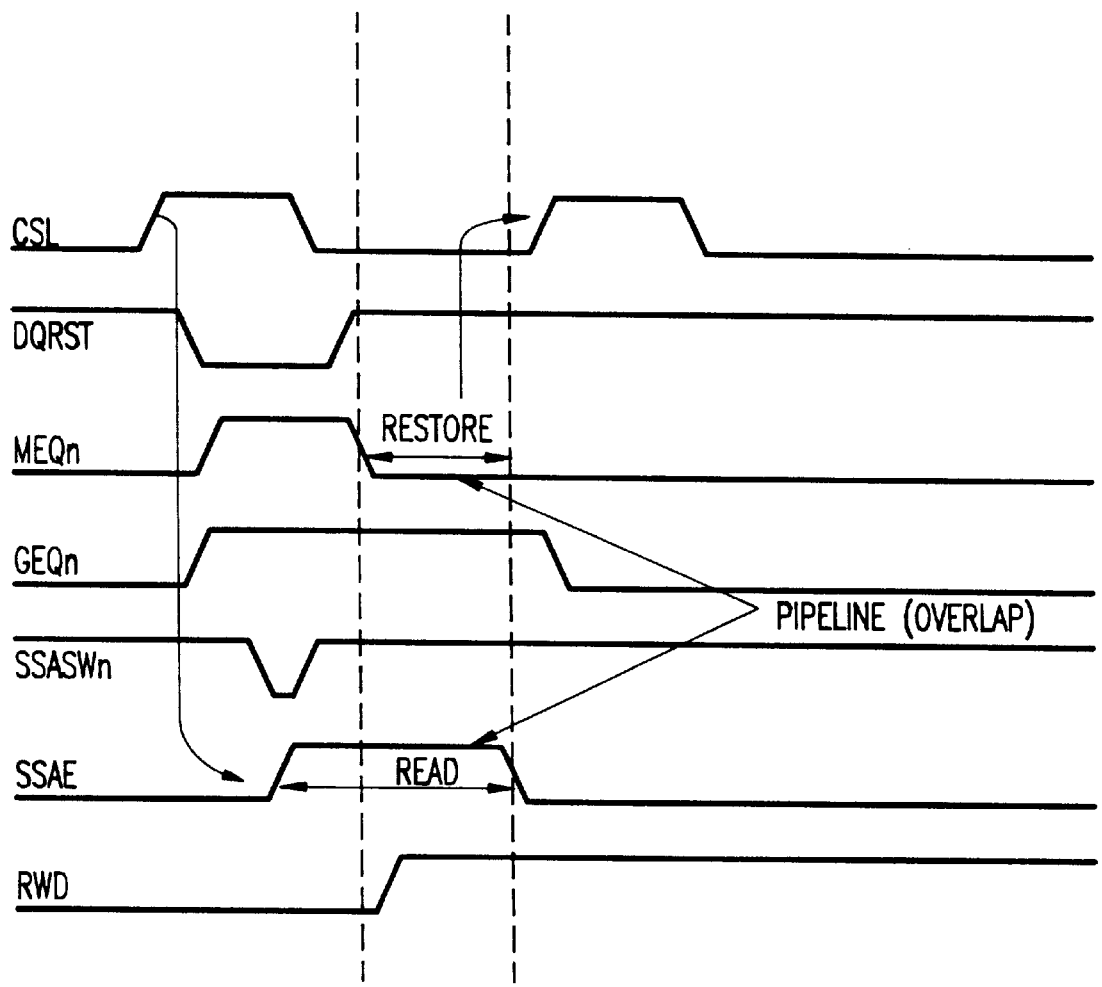
FIG. 5 shows the overlapping of the read and restore operations according to the present invention.

FIG. 4 illustrates another embodiment of the present invention. This structure consists of sense amplifier 20 and two write/restore drivers 21 and 22 and similarly includes global data buses MDQt and MDQc. Operation of the FIG. 4 embodiment is similar to that of the FIG. 1 embodiment and a discussion of similar features is hereby omitted. Unlike the FIG. 1 embodiment, the FIG. 4 embodiment does not include separate read and write data buses. Rather, there is only one read-write data bus RWD. The input to the write/restore driver circuits 21 and 22 is the write data-in DIN signal. This signal is the RWD signal level-shifted. When the RWD signal swings from ground to Vlow (0V to 1V), the write data-in DIN signal swings from ground to Vint (0V to 2V). Because of the combined read-write data bus, the FIG. 4 embodiment is limited to pipelining of the read and restore operations. FIG. 5 shows the overlapped read and restore operations of this embodiment. The prior art sense amplifier shown in FIG. 6 is not capable of this overlapping.

While the invention has been described with reference to specific embodiments, the description of the specific embodiments is illustrative only and is not to be considered as limiting the scope of the invention. Various other modifications and changes may occur to those skilled in the art without departing from the spirit and scope of the invention.

What is claimed is:

1. A method of performing overlapping operations with a memory device having a sense amplifier circuit, two drivers connected to the sense amplifier circuit and two data bus lines connected to said sense amplifier circuit to receive data signals, the method comprising:

applying a first equalize signal and second equalize signal to said sense amplifier circuit to allow said sense amplifier circuit to receive said data signals on the two data bus lines;

applying a switch signal to said sense amplifier circuit to connect the two data bus lines to a read data bus, said switch signal allowing data corresponding to said data signals to be read on the read data bus; and while said data is on the read data bus and is capable of being read, changing a state of the first equalize signal such that said data bus lines receive new data or are equalized to a predetermined voltage.

2. The method of claim 1, wherein said state of said first equalize signal is one of a high state and a low state.

3. The method of claim 1, further comprising applying a first column select signal to said sense amplifier circuit prior to applying said first and second equalize signals and applying a second column select signal to said sense amplifier after said data has been read on said read data bus and said data bus lines have received new data or have been equalized to said predetermined voltage.

4. The method of claim 1, wherein each driver includes a first and second input line to receive first and second input signals, respectively, said first and second input signals determining operational states of the sense amplifier circuit by electrically connecting the drivers to said data bus lines.

5. The method of claim 4, further comprising changing a state of at least said first input signal prior to changing said state of said first equalize signal.

6. The method of claim 1, further comprising changing a voltage on one of said data bus lines to a voltage of a power supply when said first input signal changes state.

7. The method of claim 1, wherein said read data bus is connected to said two data bus lines through sense amplifier data lines, and wherein said method further comprises applying said second equalize signal to said sense amplifier circuit to equalize said sense amplifier data lines to a potential different than a potential of said two data buses.

8. A method of performing overlapping operations with a sense amplifier circuit and a driver, the sense amplifier circuit being connected to two data bus lines to receive data and having at least one output data bus to output data, the method comprising:

applying a first equalize signal and a second equalize signal to said sense amplifier circuit to allow said sense amplifier circuit to receive data on said data bus lines;

applying a switch signal to said sense amplifier circuit to allow said data on said data bus lines to be read on said output data bus; and changing states of said first equalize signal to allow said data bus lines to be in one of a restore state and a write state while said data is being read on the output data bus.

9. The method of claim 8, wherein said driver includes a first input signal line and a second input signal line, states of said first input signal line and said second input signal line determining a signal on a connection line that connects said driver to said sense amplifier circuit, wherein said signal on said connection line controls operational states of said sense amplifier circuit.

10. The method of claim 9, further comprising changing a voltage on one of said data bus lines to a voltage of a power supply when said signal on said connection line changes state.

11. The method of claim 8, further comprising applying a first column select signal to said sense amplifier circuit prior to applying said first and second equalize signals and applying a second column select signal to said sense amplifier circuit after said data has been read on said read data bus and said data bus lines have been in one of said restore state and said write state.

12. The method of claim 8, wherein said output data bus is connected to said two data bus lines through sense amplifier data lines, and wherein said method further comprises applying said second equalize signal to said sense amplifier circuit to equalize said sense amplifier data lines to a potential different than a potential of said two data bus lines.

13. A method of performing a plurality of operations with a sense amplifier circuit having two drivers connected to said sense amplifier circuit and two data bus lines connected to said sense amplifier circuit to receive data signals, the method comprising:

applying a first equalize signal and a second equalize signal to said sense amplifier circuit to enter a first operational state of said sense amplifier circuit, said first equalize signal being a different signal than said second equalize signal; and changing a state of said first equalize signal such that portions of said sense amplifier circuit enter a second operational state while portions of said sense amplifier circuit are in said first operational state.

14. The method of claim 13, wherein the state of said first equalize signal is one of a high state and a low state.

15. The method of claim 13, further comprising applying a first column select signal to said sense amplifier circuit prior to applying said first and second equalize signals and applying a second column select signal to said sense amplifier circuit after said sense amplifier circuit has entered said second operational state.

16. The method of claim 13, further comprising applying a switch signal to said sense amplifier circuit to connect said data bus lines to a read data bus, said switch signal allowing data to be read from said data bus line to said read data bus.

17. The method of claim 13, wherein each driver includes a first and second input line to receive first and second input signals, respectively, said first and second input signals determining the operational state of the sense amplifier circuit by electrically connecting the respective driver to one of said data bus lines.

18. The method of claim 17, further comprising changing one of said data bus lines to a voltage of a power supply when the first input signal changes state.

19. The method of claim 13, wherein said sense amplifier circuit includes a read data bus connected to said two data bus lines through sense amplifier data lines, and wherein said method further comprises applying said second equalize signal to said sense amplifier circuit to equalize said sense amplifier data lines to a potential different than a potential of said two data bus lines.

20. A circuit for performing overlapping operations, the circuit comprising:

a first write/restore driver that receives two control signals on two input lines;

a second write/restore driver that receives two control signals on two input lines; and a sense amplifier circuit connected to the first write/restore driver and to said second write/restore driver, said sense amplifier circuit further being connected to first and second data bus lines to receive input data, wherein said sense amplifier circuit includes a first equalize signal line to receive a first equalize signal and a second equalize signal line to receive a second equalize signal, said sense amplifier circuit operating based on said first equalize signal and said second equalize signal so as to permit simultaneous overlapping of at least two of the following operations: reading data from the first and second data bus lines, writing data to first and second data bus lines and restoring the first and second data bus lines to an equalized state.

21. The circuit of claim 20, wherein said sense amplifier circuit includes sense amplifier data lines connected between the first and second data bus lines and a read data bus, and wherein during said read operation data passes across the amplifier data lines to said read data bus based on a switch signal.

22. The circuit of claim 21, wherein said first equalize signal line changes states to perform restoring operations on the data bus lines while said data is on said read data bus.

23. The circuit of claim 20, wherein the sense amplifier includes a first transistor and a second transistor, said first equalize signal being applied to said first transistor and said second equalize signal being applied to said second transistor.

24. The circuit of claim 20, wherein said sense amplifier circuit includes sense amplifier data lines connected between the first and second data bus lines and a read data bus, and wherein when said second equalize signal is received on the second equalize line, then the sense amplifier data lines are equalized to a potential different than a potential of the first and second data bus lines.

* * * * *